(12) United States Patent
Tang

(10) Patent No.: US 12,176,307 B2
(45) Date of Patent: Dec. 24, 2024

(54) WAVEGUIDE LAUNCHER IN PACKAGE BASED ON HIGH DIELECTRIC CONSTANT CARRIER

(71) Applicant: NXP USA, Inc., Austin, TX (US)

(72) Inventor: Jinbang Tang, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 465 days.

(21) Appl. No.: 17/541,503

(22) Filed: Dec. 3, 2021

(65) Prior Publication Data

US 2023/0178500 A1 Jun. 8, 2023

(51) Int. Cl.
*H01L 23/66* (2006.01)

(52) U.S. Cl.
CPC ...... *H01L 23/66* (2013.01); *H01L 2223/6627* (2013.01); *H01L 2223/6638* (2013.01)

(58) Field of Classification Search
CPC ............ H01L 23/66; H01L 2223/6627; H01L 2223/6638; H01L 23/552; H01L 2223/6677; G02B 6/28
See application file for complete search history.

(56) References Cited

U.S. PATENT DOCUMENTS

| | | | |
|---|---|---|---|
| 7,772,694 B2 | 8/2010 | Tang | |
| 7,842,546 B2 | 11/2010 | Tang | |
| 8,168,464 B2 | 5/2012 | Tang | |
| 8,283,764 B2 | 10/2012 | Tang | |
| 8,293,588 B2 | 10/2012 | Tang | |
| 9,136,230 B2 | 9/2015 | Demini et al. | |
| 9,520,635 B2 | 12/2016 | Fakharzadeh et al. | |
| 9,666,930 B2 | 5/2017 | Tang et al. | |
| 2020/0227821 A1* | 7/2020 | Wu | H01Q 1/38 |
| 2021/0239754 A1 | 8/2021 | Schat et al. | |

* cited by examiner

*Primary Examiner* — Mohammad A Rahman

(57) ABSTRACT

A wafer-scale die packaging device is fabricated by providing a high-k glass carrier substrate having a ceramic region which includes a defined waveguide area and extends to a defined die attach area, and then forming, on a first glass carrier substrate surface, a differential waveguide launcher having a pair of signal lines connected to a radiating element that is positioned adjacent to an air cavity and surrounded by a patterned array of conductors disposed over the ceramic region in a waveguide conductor ring. After attaching a die to the glass carrier substrate to make electrical connection to the differential waveguide launcher, a molding compound is formed to cover the die, differential waveguide launcher, and air cavity, and an array of conductors is formed in the molding compound to define a first waveguide interface perimeter surrounding a first waveguide interface interior.

11 Claims, 13 Drawing Sheets

WAVEGUIDE LAUNCHER IN PACKAGE BASED ON HIGH DIELECTRIC CONSTANT CARRIER

BACKGROUND OF THE INVENTION

Field of the Invention

The present invention is directed in general to the field of semiconductor devices. In one aspect, the present invention relates to circuit waveguide interfaces for packaged integrated circuit devices.

Description of the Related Art

Semiconductor device fabrication techniques for making integrated circuit devices typically form multiple copies of an integrated circuit in semiconductor wafers that are then singulated into individual dies, each including one or more integrated circuits or other comparable devices. The singulated dies are then mounted in a package substrate that provides external terminations or conductors in the form of leads that electrically connect each die to external assemblies such as circuit boards. After mounting a die onto a package substrate, a molding compound is typically formed on the package substrate to cover and protect the integrated circuit die. In applications that require the ability to make additional high frequency connections, such as millimeter wave systems, the external terminations may also include also waveguides to facilitate high frequency communication. In order to achieve such high frequency communication, an appropriate interface between the waveguides and packaged integrated circuit die is needed. Such interfaces can require precise manufacturing that may be not possible with conventional semiconductor manufacturing processes. Thus, the addition of such high frequency capability can add significant cost and complexity to the design and fabrication of such devices. Thus, there remains a need to provide improved techniques and structures for providing circuit waveguide interfaces to packaged integrated circuit devices.

BRIEF DESCRIPTION OF THE DRAWINGS

The present invention may be understood, and its numerous objects, features and advantages obtained, when the following detailed description of a preferred embodiment is considered in conjunction with the following drawings.

Figure 1A:
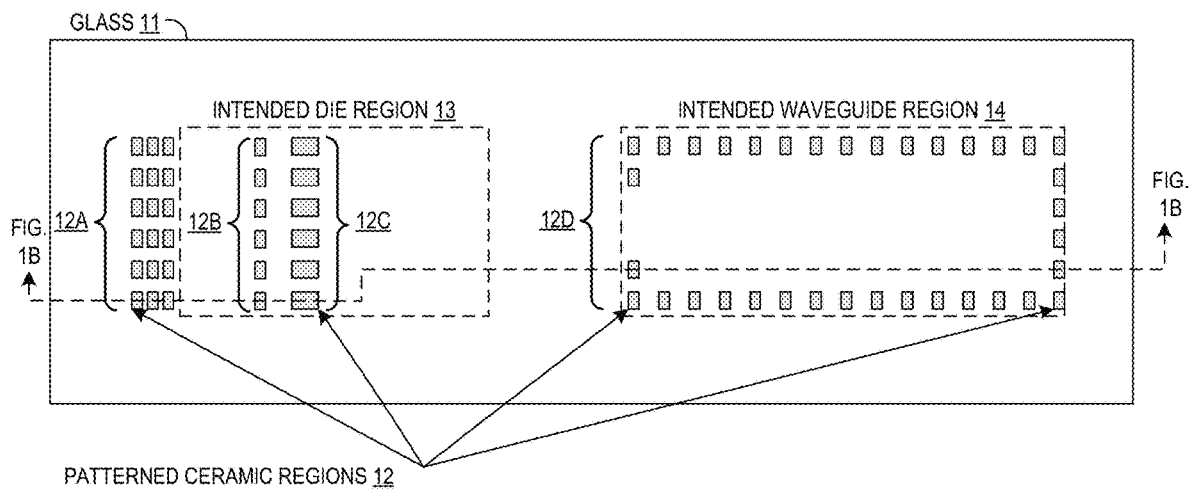
FIGS. 1A and 1B are top and cross-sectional side views of a glass wafer with one or more first patterned ceramic regions in accordance with selected embodiments of the present disclosure.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating circuit waveguide interfaces during a wafer-scale die packaging (WSDP) processes which integrates a differential pair to waveguide launcher in package (LIP) structure within the glass or ceramic carrier formed with a material having a high dielectric constant (e.g., k=5.8-6.8) and including an air cavity structure formed in the waveguide short back that is designed and constructed to provide waveguide matching and to reduce insertion loss (e.g., to approximately 0.95-1.05 dB). Specifically, during the packaging process, a high-k glass carrier substrate is processed to form one or more ceramic regions in an intended waveguide region and to form an air cavity in the one or more ceramic regions. Either before or after forming the air cavity, conductive layers are formed defining a differential pair radiating element located on a first carrier substrate surface adjacent to the air cavity, a reflector interface layer located on a second carrier substrate surface, and a conductive via wall or ring structure located in the one or more ceramic regions that surrounds the intended waveguide region and connects the reflecting element to the first carrier substrate surface. After covering the air cavity with a substrate cap sheet, a singulated die is attached on the high-k glass carrier substrate and a molding compound is applied to over the die, substrate cap sheet, and differential pair radiating element. As needed, a conductive via wall or ring structure is formed in the molding compound to surround the intended waveguide region and to electrically connect to the conductive via wall or ring formed in the one or more ceramic regions. In this way, a circuit waveguide interface is formed from the conductive via wall or ring structures formed in the molding compound and one or more ceramic regions around the intended waveguide region. In addition or in the alternative, an electro-magnetic interference (EMI) O-ring gasket formed with metallic or metal-coated particles in EMI silicones can be bonded between the molding compound and circuit waveguide interface. By forming the differential pair radiating element on the first carrier substrate surface (instead of in the circuit waveguide interface), the LIP transition loss may be significantly reduced to 1.0 dB while also relaxing tolerance control requirements for alignment of critical elements. The embodiments described herein use WSDP processes to both form the package and form a circuit waveguide interface integrated with the package, and thus can facilitate the formation of the circuit waveguide interface with both relatively high precision and relatively low cost and complexity.

In WSDP processes, singulated die are arranged on a wafer-like carrier panel for processing and packaging. The singulated die on the carrier panel are then covered with molding compound that will harden to provide the bodies of the packages of the die on the carrier panel. Photolithography and other wafer-type processing techniques are used to form one or more metallization layers (e.g., copper) that provide connections from the die to outside the package. In WSDP processing, these connections can be formed on the top and bottom sides of the molded die, and can include interconnects between metallization layers. For example, metallization layers on one side can be formed for die-to-die connections, and metallization layers on the other side can be formed to provide landing pad arrays. The molded die on the panel is then singulated into discrete packages. As will be described in greater detail below, the embodiments herein provide a technique for forming a circuit waveguide interface during such a wafer-scale die packaging process.

Figure 1B:
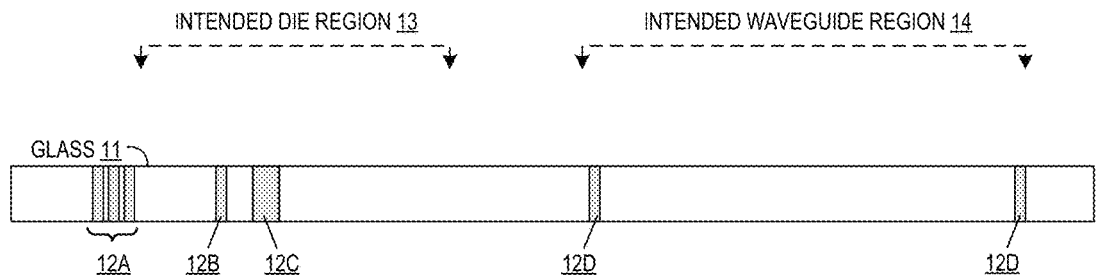

Turning now to FIGS. 1A and 1B, a top view 10A and cross-sectional side view 1B (through line FIG. 1B-FIG. 1B of FIG. 1A) are illustrated of a glass wafer 11 with one or more first patterned ceramic regions 12A-D at a first stage of a package fabrication process in accordance with selected embodiments of the present disclosure. The glass wafer 11 may be initially formed as a "photo-structurable glass" with a high-k dielectric material having a high dielectric constant (e.g., k>3.9). In selected embodiments, the glass wafer 11 may be formed with an APEX® Glass wafer containing special sensitizers that allow unique anisotropic 3D features to be formed through a simple exposure step. Using standard IC processing tools, patterned ceramic regions 12 may be formed in the glass wafer 11 at predetermined locations. For example, the glass wafer 11 may be exposed to a first mask pattern and then baked to convert the exposed regions of the glass 11 into patterned ceramic regions 12 which extend through the glass wafer 11. By defining the locations of the mask openings, a first set of patterned ceramic regions 12A may be positioned outside of the intended die region 13 and a second set of patterned ceramic regions 12B-C may be positioned inside the intended die region 13. In addition, a third set of patterned ceramic regions 12D may be positioned around the periphery of an intended wave guide region 14.

Figure 2A:
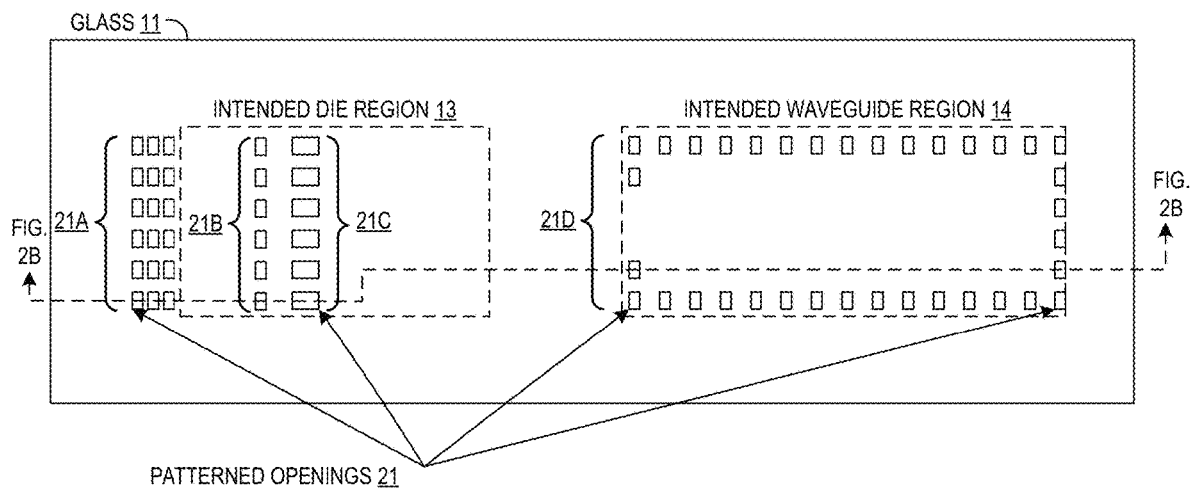
FIGS. 2A and 2B are top and cross-sectional side views of a glass wafer with patterned openings in accordance with selected embodiments of the present disclosure.
Figure 2B:
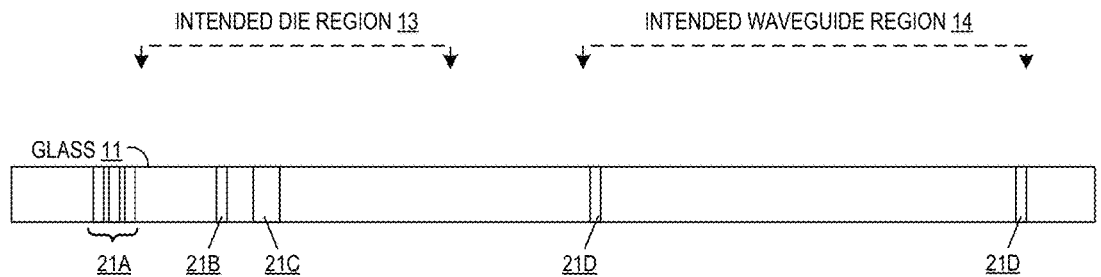

Turning now to FIGS. 2A and 2B, a top view 20A and cross-sectional side view 20B (through line FIG. 2B-FIG. 2B of FIG. 2A) are illustrated of a glass wafer 11 with one or more patterned openings 21 at a stage of a package fabrication process after FIG. 1. While any suitable etch process may be used, the patterned openings 21 may be formed by applying a wet etch to remove the patterned ceramic regions 12, thereby leaving the patterned openings 21 which extend through the glass wafer 11. As formed, the patterned openings 21 may include a first set of patterned openings 21A positioned outside of the intended die region 13 and a second set of patterned openings 21B-C positioned inside the intended die region 13. In addition, a third set of patterned openings 21D may be positioned around the periphery of an intended wave guide region 14.

Figure 3A:
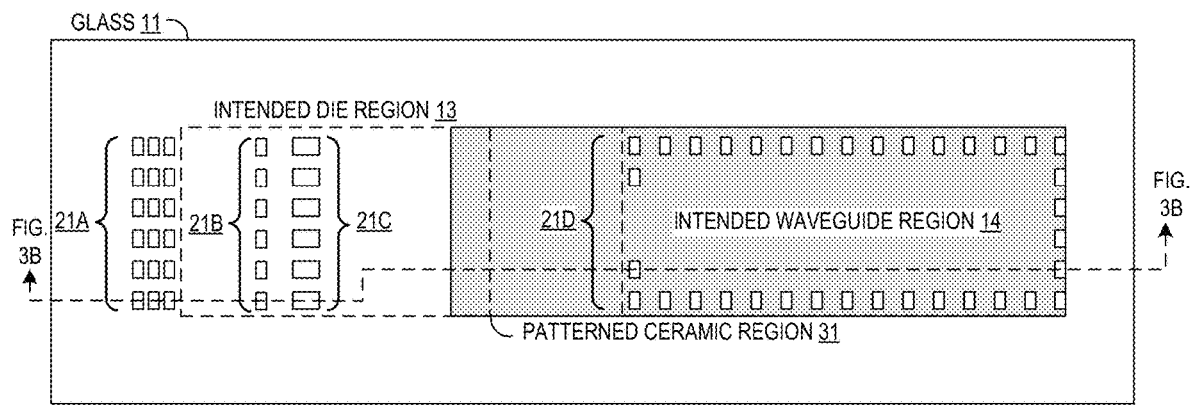
FIGS. 3A and 3B are top and cross-sectional side views of a glass wafer with one or more second patterned ceramic regions for the intended waveguide region in accordance with selected embodiments of the present disclosure.
Figure 3B:
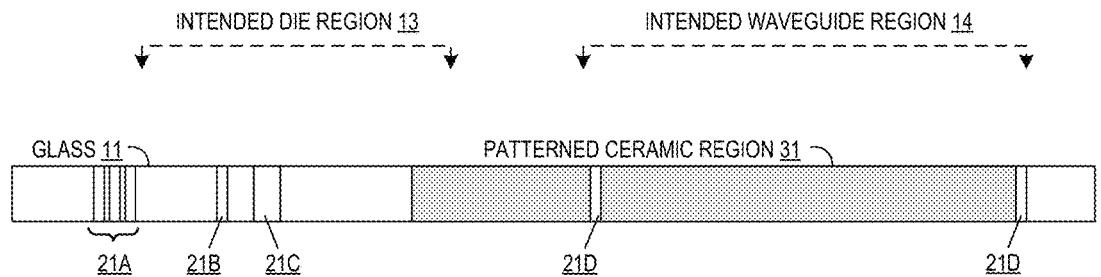

Turning now to FIGS. 3A and 3B, a top view 30A and cross-sectional side view 30B (through line FIG. 3B-FIG. 3B of FIG. 3A) are illustrated of a glass wafer 11 with one or more second patterned ceramic regions 31 for the intended waveguide region 14 at a stage of a package fabrication process after FIG. 2. At this point in the fabrication process when the glass wafer 11 already has the patterned openings 21D formed in the intended waveguide region 14, the patterned ceramic region(s) 31 may be formed by exposing the glass wafer 11 to a second mask pattern and then applying a second bake process to convert the exposed region(s) of the glass 11 into one or more second patterned ceramic regions 31 which extend through the glass wafer 11. By defining the locations of the openings in the second mask, the second patterned ceramic region(s) 31 may be positioned to encompass and include the intended wave guide region 14 and to extend into the intended die region 13.

Figure 4A:
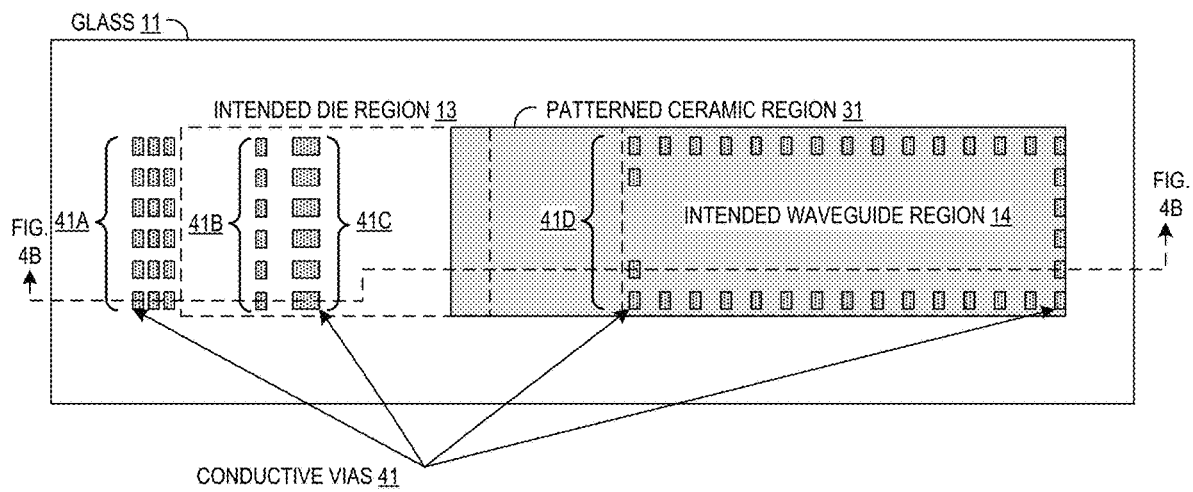
FIGS. 4A and 4B are top and cross-sectional side views of a glass wafer with a patterned conductive vias in accordance with selected embodiments of the present disclosure.
Figure 4B:
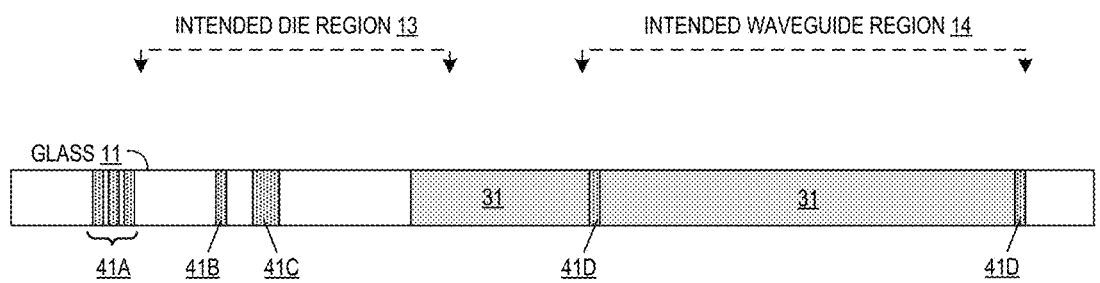

Turning now to FIGS. 4A and 4B, a top view 40A and cross-sectional side view 40B (through line FIG. 4B-FIG. 4B of FIG. 4A) are illustrated of a glass wafer 11 with patterned conductive vias 41 formed at a stage of a package fabrication process after FIG. 3. At this point in the fabrication process when patterned openings 21 are already formed in the glass wafer 11, the patterned conductive vias 41 may be formed with one or more conductive layers, such as by depositing (e.g., vapor deposition, electroplating, sputtering) one or more conductive materials (e.g., copper) to fill the patterned openings 21 and then applying a polish or etch process to remove the conductive layer(s) from the first and second carrier substrate surfaces. As formed, the patterned conductive vias 41 may include a first set of patterned conductive vias 41A positioned outside of the intended die region 13 and a second set of patterned conductive vias 41B-C positioned inside the intended die region 13. In addition, a third set of patterned conductive vias 41D may be positioned around the periphery of an intended wave guide region 14 except for any location which will overlap with a subsequently-formed differential pair to waveguide launcher in package (LIP) structure.

Figure 5A:
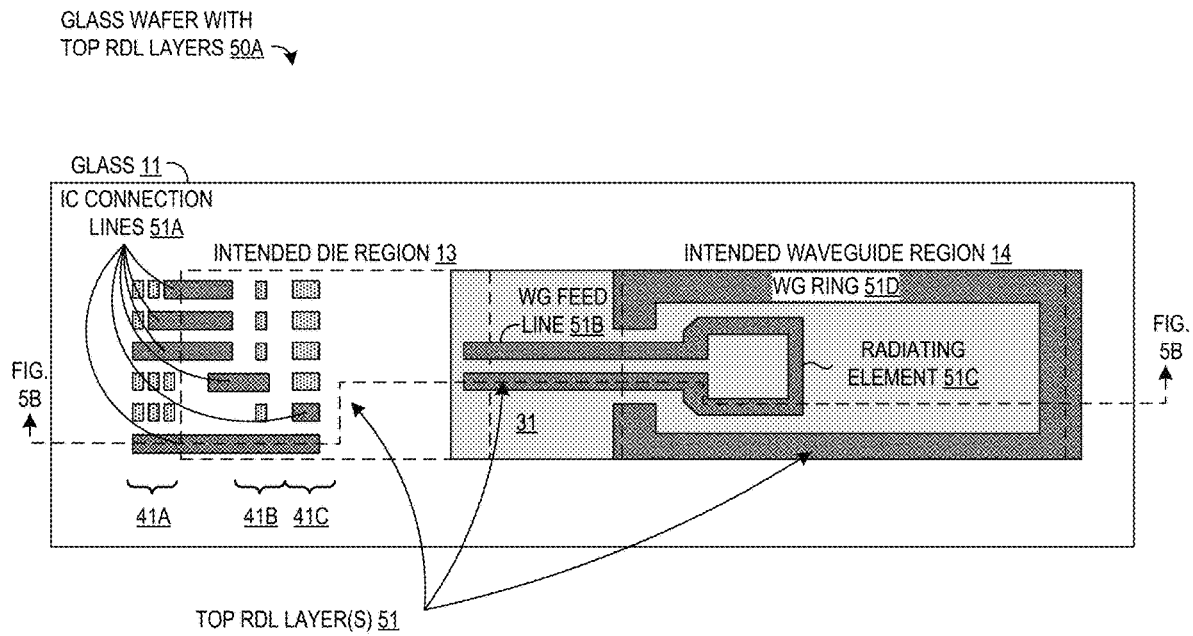
FIGS. 5A and 5B are top and cross-sectional side views of a glass wafer with patterned redistribution layers, including a radiating element in the intended waveguide region, in accordance with selected embodiments of the present disclosure.
Figure 5B:
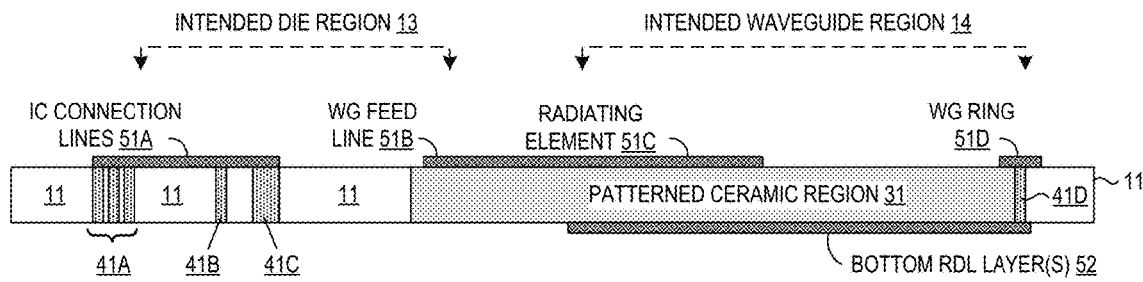

Turning now to FIGS. 5A and 5B, a top view 50A and cross-sectional side view 50B (through line FIG. 5B-FIG. 5B of FIG. 5A) are illustrated of a glass wafer 11 with patterned redistribution layers (RDLs) 51, 52, including a radiating element 51B-C in the intended waveguide region 14, at a stage of a package fabrication process after FIG. 4. At this point in the fabrication process, the patterned top RDLs 51 and bottom RDLs 52 may be formed directly on the first and second carrier substrate surfaces using any suitable process for depositing and patterning one or more conductive layers. For example, the patterned top RDLs 51 may be formed by sputter depositing a seed layer over the glass/ceramic carrier 11, forming a patterned photoresist mask with defined RDL openings corresponding to the desired RDL features, electroplating one or more conformal conductive layers in the RDL openings, stripping the patterned photoresist mask, and then etching the exposed seed layer from the surface of the glass/ceramic carrier 11 to define the top RDLs 51. As formed, the top RDLs may include one or more IC connection lines or routing lines 51A which are positioned to overlap with and connect selected patterned conductive vias 41A (positioned outside of the intended die region 13) with selected patterned conductive vias 41B-C (positioned inside the intended die region 13). In addition, the top RDLs may include a separately defined loop layer which includes a pair of parallel waveguide lines 51B (which are positioned to extend from the intended die region 13 to the intended waveguide region 14) and a radiating element 51C (which is positioned in the intended waveguide region 14 to connect the pair of parallel waveguide feed lines 51B in a loop). In addition, the top RDLs may include a separately defined outer waveguide ring layer 51D which has an open interior space and which is positioned around the periphery of the intended waveguide region 14 except for a gap where the waveguide feed lines 51B are located. Thus formed, the waveguide feed lines 51B and radiating element 51 form a differential pair to waveguide launcher in package (LIP) structure on the top carrier substrate surface which is positioned to extend from the intended die region 13 to the interior location surrounded of the intended waveguide region by the waveguide ring layer 51D while leaving space for a subsequently-formed air cavity.

In similar fashion, the patterned bottom RDLs 52 may be formed (including a waveguide short metal plane in the waveguide region) by using any suitable process for depositing and patterning one or more conductive layers on the bottom carrier substrate surface. As formed, the bottom RDL layer(s) may define a waveguide reflector interface layer which is positioned on the bottom carrier substrate surface to overlap with the outer waveguide ring layer 51D, including its interior space so as to cover the entire area of the intended waveguide region 14. In FIG. 5B, it is noted that the patterned conductive vias 41A-D are depicted at the intersection with the through line (FIG. 5B-FIG. 5B) at the intended die region 13, and that there is no patterned conductive via 41D depicted at the interior side of the intended waveguide region 14 (adjacent the intended die region 13) where the through line (FIG. 5B-FIG. 5B) is positioned in alignment with the underlying waveguide lines 51B.

Figure 6A:
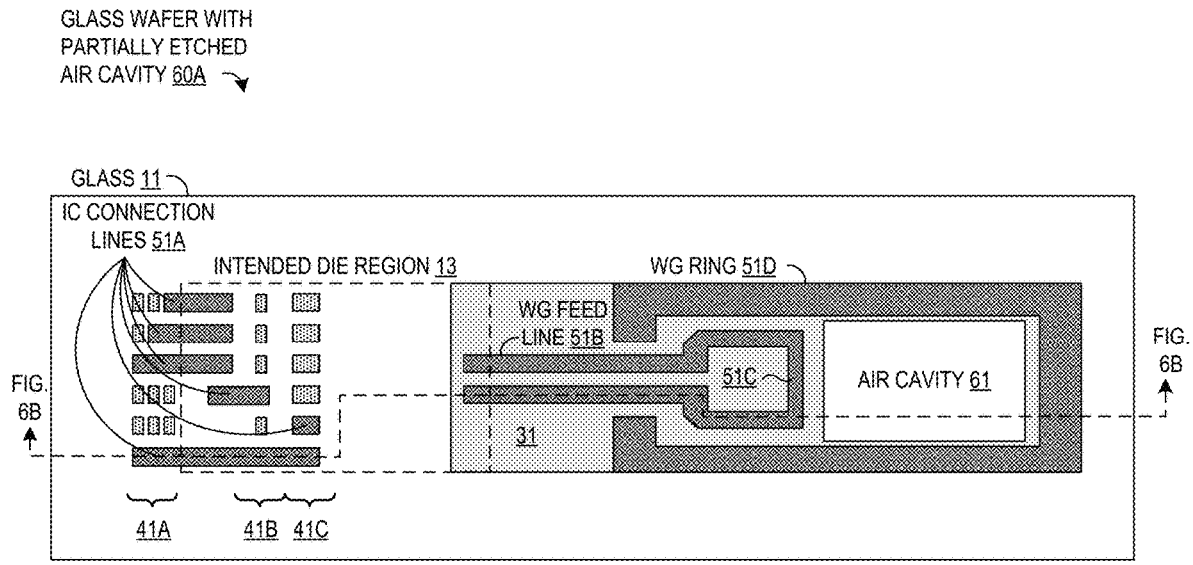
FIGS. 6A and 6B are top and cross-sectional side views of a glass wafer with a partially etched air cavity in the intended waveguide region in accordance with selected embodiments of the present disclosure.
Figure 6B:
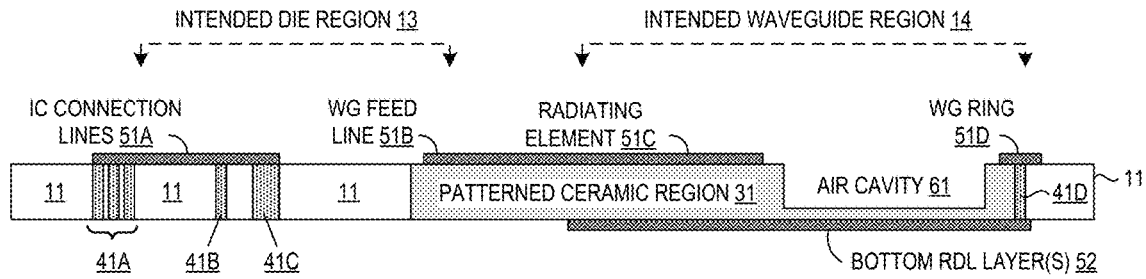

Turning now to FIGS. 6A and 6B, a top view 60A and cross-sectional side view 60B (through line FIG. 6B-FIG. 6B of FIG. 6A) are illustrated of a glass wafer 11 with a partially etched air cavity 61 in the intended waveguide region at a stage of a package fabrication process after FIG. 5. While any suitable recess etch process may be used, the air cavity 61 may be formed by applying a solder mask to cover the first and second carrier substrate surfaces except for an exposed area in the patterned ceramic region 31 where the air cavity 61 will be formed, and the performing a recess etch of the exposed ceramic region 31 using a timed anisotropic etch to form the air cavity 61. The process parameters and timing of the recess etching should be controlled to etch a specified depth which leaves a thin layer of the patterned ceramic region 31 below the air cavity 61 at the bottom ceramic carrier substrate surface, thereby defining a waveguide short back below the differential pair to waveguide LIP structure 51B/C. In addition, a patterned mask and etch process may be controlled so that the air cavity 61 is positioned inside the intended waveguide region 14 and adjacent to the differential pair to waveguide LIP structure 51B/C. As will be appreciated, the recess etching control process parameters may require a specified minimum thickness of the glass/ceramic carrier 11 in order to guarantee the required thickness parameters for the waveguide back short. In FIG. 6B, it is noted that the patterned conductive vias 41A-D are depicted at the intersection with the through line (FIG. 6B-FIG. 6B) at the intended die region 13, and that there is no patterned conductive via 41D depicted at the interior side of the intended waveguide region 14 (adjacent the intended die region 13) where the through line (FIG. 6B-FIG. 6B) is positioned in alignment with the underlying waveguide lines 51B.

Figure 7A:
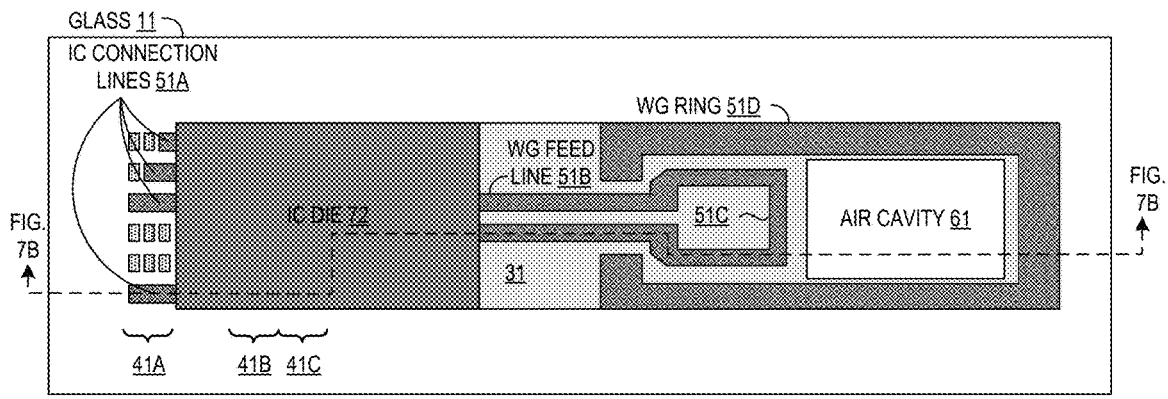
FIGS. 7A and 7B are top and cross-sectional side views of a glass wafer with an attached die in accordance with selected embodiments of the present disclosure.
Figure 7B:
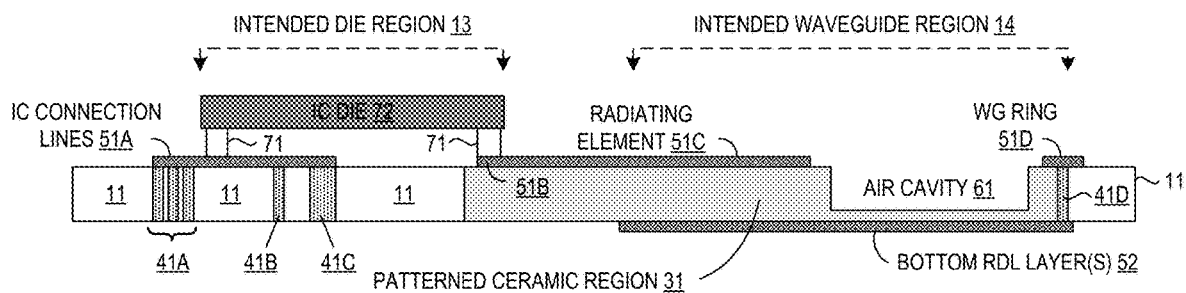

Turning now to FIGS. 7A and 7B, a top view 70A and cross-sectional side view 70B (through line FIG. 7B-FIG. 7B of FIG. 7A) are illustrated of a glass wafer 11 with one or more attached die 72 at a stage of a package fabrication process after FIG. 6. In accordance with the embodiments described herein, the fabricated IC die 72 may include one or more radio frequency (RF) devices that are to be coupled to a waveguide through a waveguide interface. As will be appreciated, the die 72 may include an active side on the bottom where fabricated electronic circuits and electrical contacts are formed, and an inactive side on the top side opposite to the active side. Using any suitable bonding or attachment mechanism, a plurality of contact pads 71 is used to electrically connect the electrical contacts on the bottom active side of the die 72 over the top RLD layers 51A and to the underlying patterned conductive vias 41A-C. In WSDP processes, a plurality of singulated die are arranged for placement and attachment over a corresponding plurality of intended die regions 13 of the glass/ceramic carrier 11 for processing and packaging. In FIG. 7B, it is noted that the patterned conductive vias 41A-D are depicted at the intersection with the through line (FIG. 7B-FIG. 7B) at the intended die region 13, and that there is no patterned conductive via 41D depicted at the interior side of the intended waveguide region 14 (adjacent the intended die region 13) where the through line (FIG. 7B-FIG. 7B) is positioned in alignment with the underlying waveguide feed lines 51B.

Figure 8A:
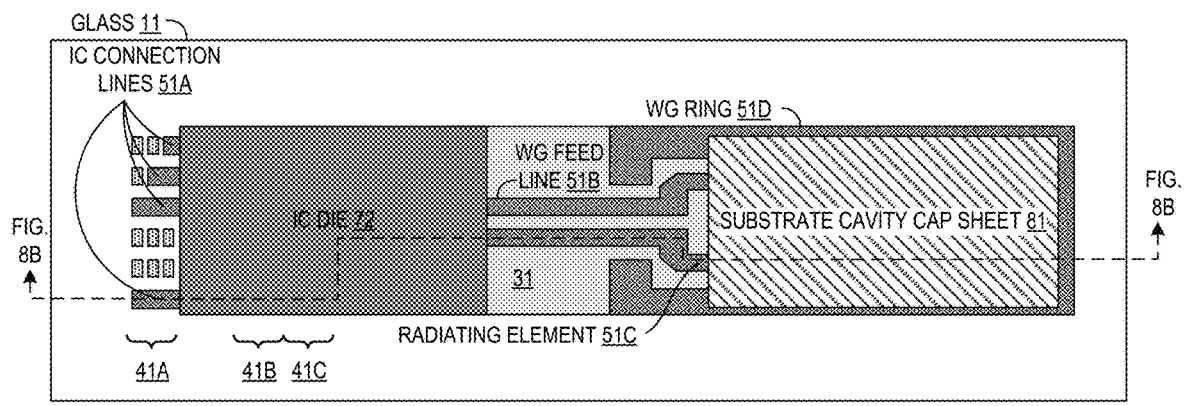
FIGS. 8A and 8B are top and cross-sectional side views of a glass wafer with an attached substrate cavity cap sheet covering the air cavity in accordance with selected embodiments of the present disclosure.
Figure 8B:
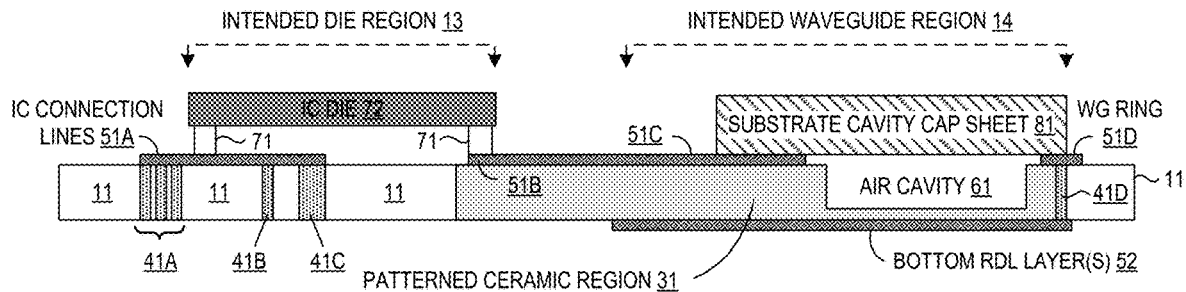

Turning now to FIGS. 8A and 8B, a top view 80A and cross-sectional side view 80B (through line FIG. 8B-FIG. 8B of FIG. 8A) are illustrated of a glass wafer 11 with an attached substrate cavity cap sheet 81 covering the air cavity 61 at a stage of a package fabrication process after FIG. 7. In accordance with the embodiments described herein, the substrate cavity cap sheet 81 may be formed with any suitable laminate or non-conductive bonding attachment process for forming a low loss dielectric to reduce the transition loss. For example, Rogers Corporation makes RT/duroid 5880 laminates having low dielectric constant and low dielectric loss properties that are well suited for high frequency/broadband applications. As attached, the substrate cavity cap sheet 81 will prevent the air cavity 61 from being filled by molding compound material. However, in embodiments where an air cavity is formed internally within the patterned ceramic region 31, then there is no need for the protective substrate cavity cap sheet 81. In FIG. 8B, it is noted that the patterned conductive vias 41A-D are depicted at the intersection with the through line (FIG. 8B-FIG. 8B) at the intended die region 13, and that there is no patterned conductive via 41D depicted at the interior side of the intended waveguide region 14 (adjacent the intended die region 13) where the through line (FIG. 8B-FIG. 8B) is positioned in alignment with the underlying waveguide feed lines 51B.

Figure 9A:
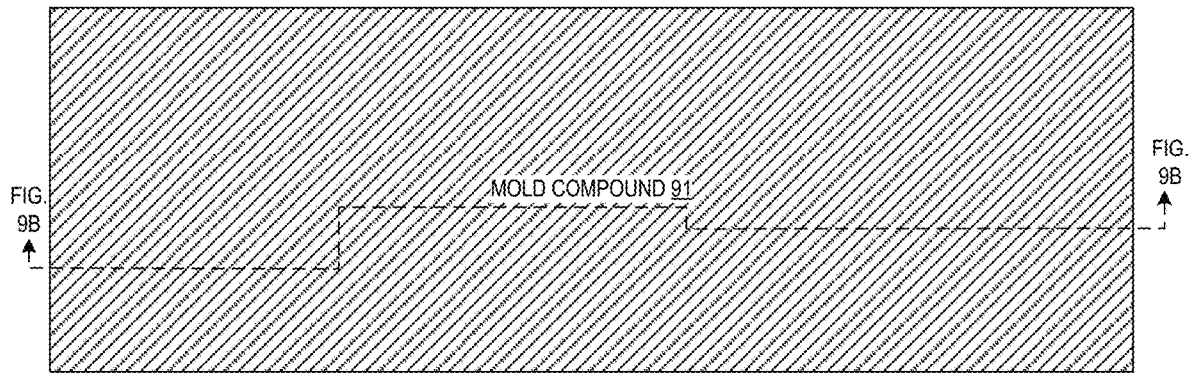
FIGS. 9A and 9B are top and cross-sectional side views of a glass wafer with a mold compound formed over the die and cavity cap sheet in accordance with selected embodiments of the present disclosure.
Figure 9B:
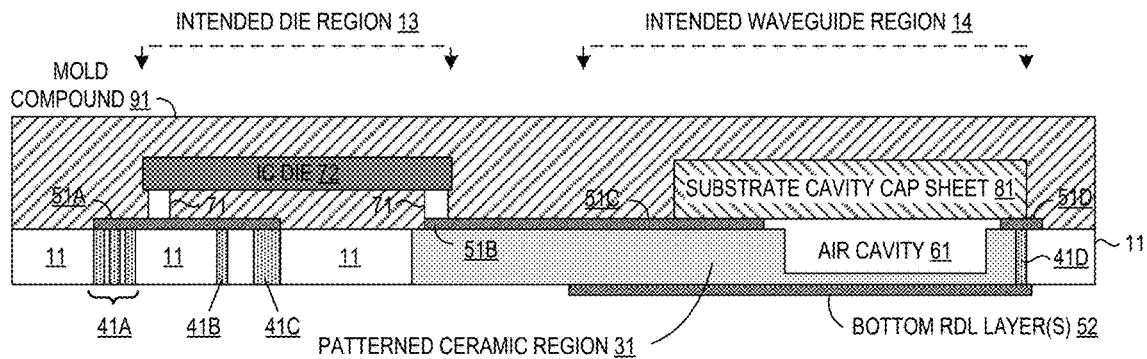

Turning now to FIGS. 9A and 9B, a top view 90A and cross-sectional side view 90B (through line FIG. 9B-FIG. 9B of FIG. 9A) are illustrated of a glass wafer 11 with a mold compound 91 formed over the die 72 and cavity cap sheet 81 at a stage of a package fabrication process after FIG. 8. Formed with any suitable molding compound deposit process, the molding compound 91 has a first (top) side and a second (bottom) side which is attached to the first (top) side of the glass/ceramic carrier 11 to encapsulate and cover the RDL layers 51, die 72, and cavity cap sheet 81. For example, in WSDP processing, the molding compound is typically applied in a liquid or semi-liquid state to cover the arrangement of IC die 72 and associated other components on the glass/ceramic carrier 11. The applied molding compound may then be subjected to vacuum to extract bubbles that could otherwise create voids in the molding compound, and then cured and (optionally) planarized after curing. As indicated above, the cavity cap sheet 81 prevents the molding compound material 81 from filling the air cavity 61 in the intended waveguide region 14. In FIG. 9B, it is noted that the patterned conductive vias 41A-D are depicted at the intersection with the through line (FIG. 9B-FIG. 9B) at the intended die region 13, and that there is no patterned conductive via 41D depicted at the interior side of the intended waveguide region 14 (adjacent the intended die region 13) where the through line (FIG. 9B-FIG. 9B) is positioned in alignment with the underlying waveguide lines 51B.

Figure 10A:
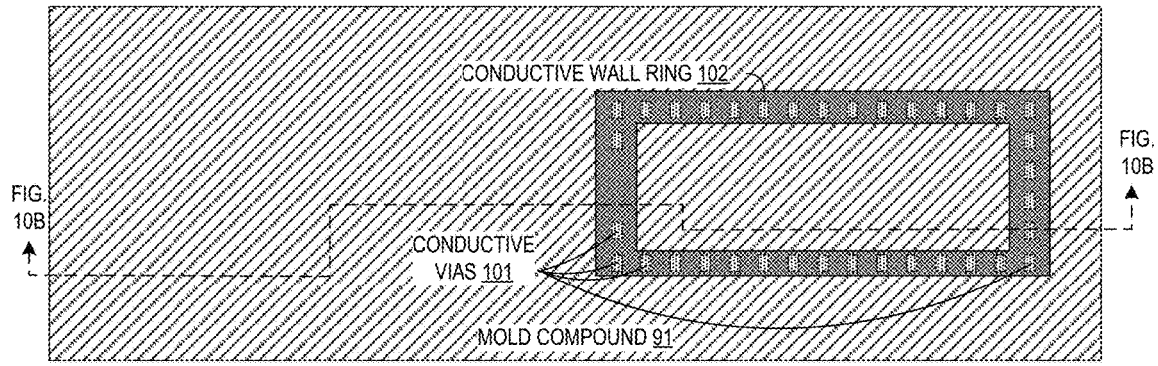
FIGS. 10A and 10B are top and cross-sectional side views of a glass wafer and mold compound with conductive vias and wall rings formed around the intended waveguide region in accordance with selected embodiments of the present disclosure.
Figure 10B:
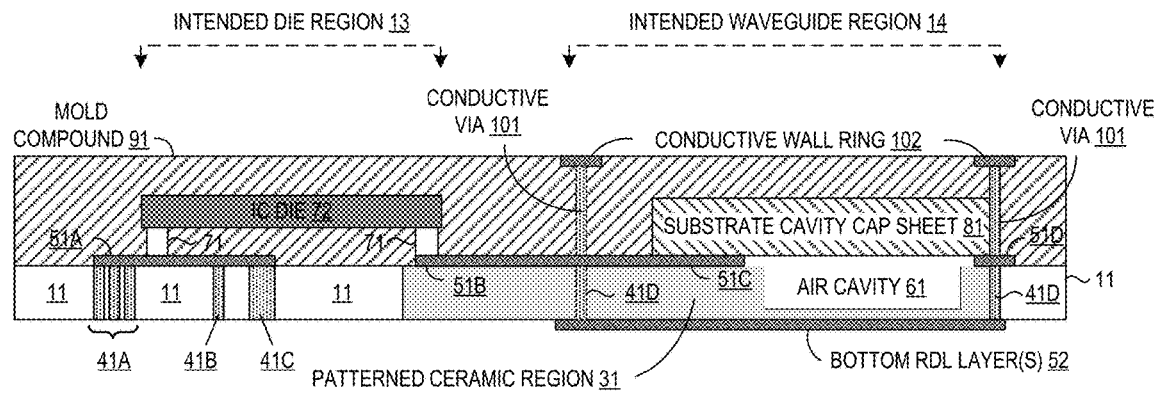

Turning now to FIGS. 10A and 10B, a top view 100A and cross-sectional side view 100B (through line FIG. 10B-FIG. 10B of FIG. 10A) are illustrated of a glass wafer 11 with conductive vias 101 and wall rings 102 formed in the molding compound 91 around the intended waveguide region at a stage of a package fabrication process after FIG. 9. As a preliminary step, a patterned array of via openings positioned around the periphery of an intended wave guide region 14 may be formed in the molding compound 92 using any suitable processing steps (e.g., pattern and etch, laser drilling, etc.), and then filled with one or more conductive layers and optionally polished or planarized. Thus constructed, the filled vias form a first array of conductive vias 101 that will define a waveguide interface perimeter in the molding compound 91 which is positioned around the periphery of the intended wave guide region 14 except for a gap where the waveguide lines 51B are located. Alternatively the first array of conductive vias 101 can be formed with a single conductive ring which is positioned around the periphery of the intended wave guide region 14 except for a gap where the waveguide lines 51B are located.

After forming the first array of conductive vias 101 in the mold compound 91, a patterned wall ring 102 may be formed on the molding compound 91 to make direct electrical connect to the conductive vias 101 using any suitable process for depositing and patterning one or more conductive layers. For example, the patterned wall ring 102 may be formed by sputter depositing a seed layer over the molding compound 91, forming a patterned photoresist mask with defined mask openings corresponding to the desired ring pattern, electroplating one or more conformal conductive layers in the mask opening, stripping the patterned photoresist mask, and then etching the exposed seed layer from the surface of the molding compound 91 to define the patterned wall ring 102 which has an open interior space and which is positioned around the periphery of the intended wave guide region 14.

Having formed the conductive vias 101 by etching vias and filling the vias with conductive material, the conductive vias 101 each extend from a first (bottom) side of the molding compound 91 to a second (top) side of the molding compound 91, thereby defining a first waveguide interface perimeter surrounding a first waveguide interface interior. The patterned wall ring 102 is also formed on the upper surface of the molding compound 91 in alignment with the conductive vias 101 to further define the first waveguide interface perimeter surrounding the first waveguide interface interior. In FIG. 10B, it is noted that the patterned conductive vias 41A-D, 101 are depicted at the intersection with the through line (FIG. 10B-FIG. 10B) at the intended die region 13, and while there are no patterned conductive vias 41D, 101 in alignment with the underlying waveguide feed lines 51B, the positions of the next adjacent patterned conductive vias 41D, 101 at the interior side of the intended waveguide region 14 (adjacent the intended die region 13) are illustrated in semi-transparent form (dotted lines) for clarity.

As disclosed herein, the conductive vias 101 may be formed by depositing and curing the molding compound, etching vias in the molding compound, and then filling the vias with conductive materials. However, this this is just one example technique. In other embodiments, the conductive vias 101 can be formed by arranging pre-formed conductive studs on the glass/ceramic carrier and then covering the conductive studs with molding compound. In such embodiments, the conductive studs would typically be placed on the glass/ceramic carrier concurrently with the placement of the die 72, either before or after attaching the cavity cap sheet 81. Then, the deposited molding compound 91 would cover both the die 72 and the conductive studs. Thus, this technique can simplify the formation of the conductive vias 101 that are used to define the waveguide interface perimeter. In other embodiments, the conductive vias 101 can be formed with a conductive ring. In this embodiment, the conductive ring would typically be placed on the glass/ceramic carrier concurrently with the placement of die. Then, the deposited molding compound would cover both the die 72 and the ring.

Figure 11A:
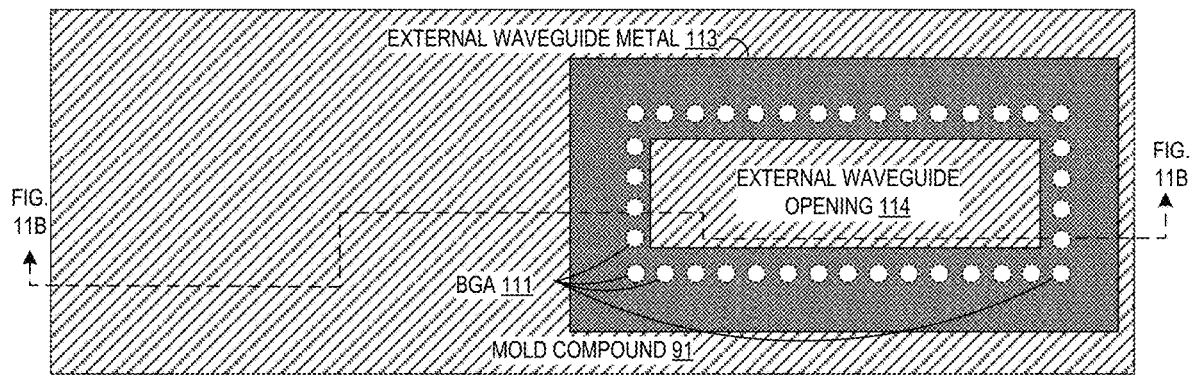
FIGS. 11A and 11B are top and cross-sectional side views of a glass/ceramic wafer and mold compound with an external waveguide attached in accordance with selected embodiments of the present disclosure.
Figure 11B:
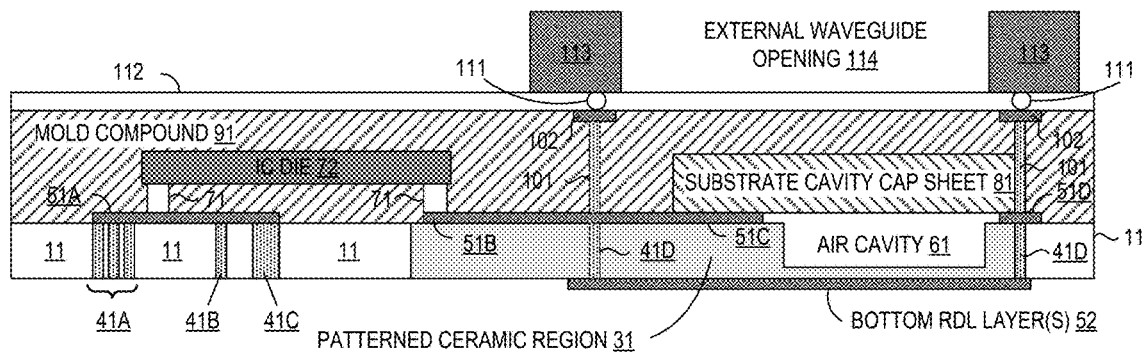

Turning now to FIGS. 11A and 11B, a top view 110A and cross-sectional side view 110B (through line FIG. 11B-FIG. 11B of FIG. 11A) are illustrated of a glass/ceramic wafer 11 and mold compound 91 with an external waveguide 113 at a stage of a package fabrication process after FIG. 10. While any suitable package terminations or connections may be attached to the packaged mold compound 91, selected embodiments of the present disclosure may be implemented by adding electrical leads to the package. For example, a ball grid array (BGA) 111 or other leads can be attached to the patterned wall ring 102 around the perimeter of the circuit waveguide interface for use in connecting the circuit waveguide interface to a waveguide or other element. Specifically, a ball grid array (BGA) of balls 111 is shown attached to the patterned wall ring 102 on the top surface of the mold compound 91. In general, the conductor balls 111 are coupled to the patterned wall ring 102 to overlap and follow the perimeter of the circuit waveguide interface that surrounds the first waveguide interface interior, thereby extending the circuit waveguide interface to outside the molding compound 91 for use in coupling the circuit waveguide interface to an external waveguide 113. Though not required, an additional structural layer 112, such as an area underfill in the BGA region, is shown as being formed on the mold compound 91 with a non-conductive material to surround and support the BGA 111 and to enable stable attachment of an external waveguide 113.

In accordance with selected embodiments of the present disclosure, the external waveguide 113 may be formed with an external waveguide metal layer 113 that is formed in a ring or cylinder to define and surround an external waveguide opening 114. In addition or in the alternative, the external waveguide 113 may be attached to the package waveguide interface with solder material. In FIG. 11B, it is noted that the patterned conductive vias 41A-D, 101 are depicted at the intersection with the through line (FIG. 11B-FIG. 11B) at the intended die region 13, and while there are no patterned conductive vias 41D, 101 in alignment with the underlying waveguide lines 51B, the positions of the next adjacent patterned conductive vias 41D, 101 at the interior side of the intended waveguide region 14 (adjacent the intended die region 13) are illustrated in semi-transparent form (dotted lines) for clarity.

Figure 12A:
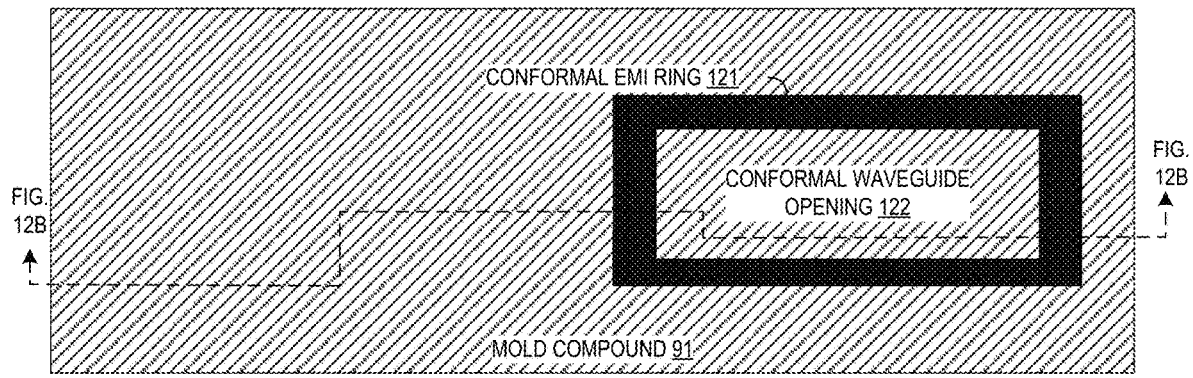
FIGS. 12A and 12B are top and cross-sectional side views of a glass wafer and mold compound with an external waveguide attached in accordance with selected embodiments of the present disclosure.
Figure 12B:
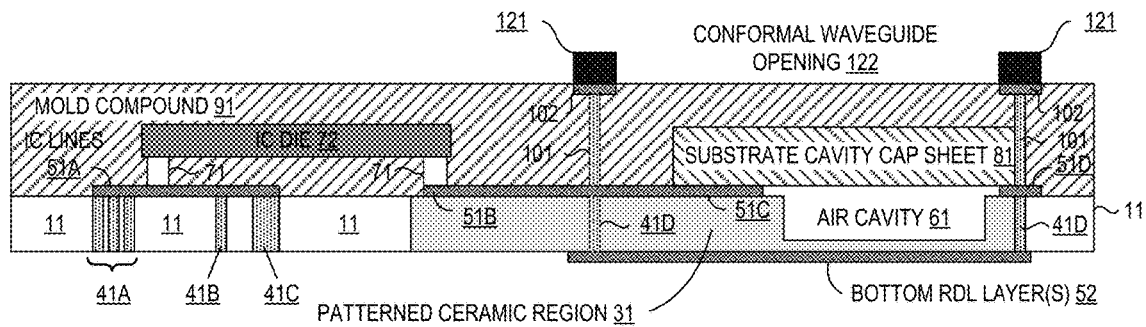

Turning now to FIGS. 12A and 12B, a top view 120A and cross-sectional side view 120B (through line FIG. 12B-FIG. 12B of FIG. 12A) are illustrated of a glass/ceramic wafer 11 and mold compound 91 with a conformal electromagnetic isolation (EMI) gasket ring 121 at a stage of a package fabrication process after FIG. 10. Formed to provide an attachment mechanism for an external waveguide, the conformal EMI gasket ring 121 may be implemented as a thin layer of conductive material that is bonded onto the molding compound 91 at the waveguide interface location to make electrical contact with the patterned wall ring 102. In such embodiments, the conformal EMI gasket ring 121 may be attached using compression to maintain contact with mating surfaces of the patterned wall ring 102. In addition, the conformal EMI gasket ring 121 may be formed with metallic or metal-coated particles in EMI silicones that conduct electricity to/from the patterned wall ring 102. In other embodiments, the conformal EMI gasket ring 121 may be implemented as a 3D printed EMI O-ring formed with a conductive silicone to provide conductive contact between interfaces under compression. In such embodiments, the EMI O-ring "bounces back" when the force is removed. In general, the conformal EMI gasket ring 121 is coupled to the patterned wall ring 102 to overlap and follow the perimeter of the circuit waveguide interface that surrounds the first waveguide interface interior, thereby extending the circuit waveguide interface to outside the molding compound 91 for use in coupling the circuit waveguide interface to an external waveguide. As disclosed herein, the conformal EMI gasket ring 121 is formed in a rectangular ring, cylinder or box to define and surround an external waveguide opening 122. In FIG. 12B, it is noted that the patterned conductive vias 41A-D, 101 are depicted at the intersection with the through line (FIG. 12B-FIG. 12B) at the intended die region 13, and while there are no patterned conductive vias 41D, 101 in alignment with the underlying waveguide lines 51B, the positions of the next adjacent patterned conductive vias 41D, 101 at the interior side of the intended waveguide region 14 (adjacent the intended die region 13) are illustrated in semi-transparent form (dotted lines) for clarity.

Figure 13:
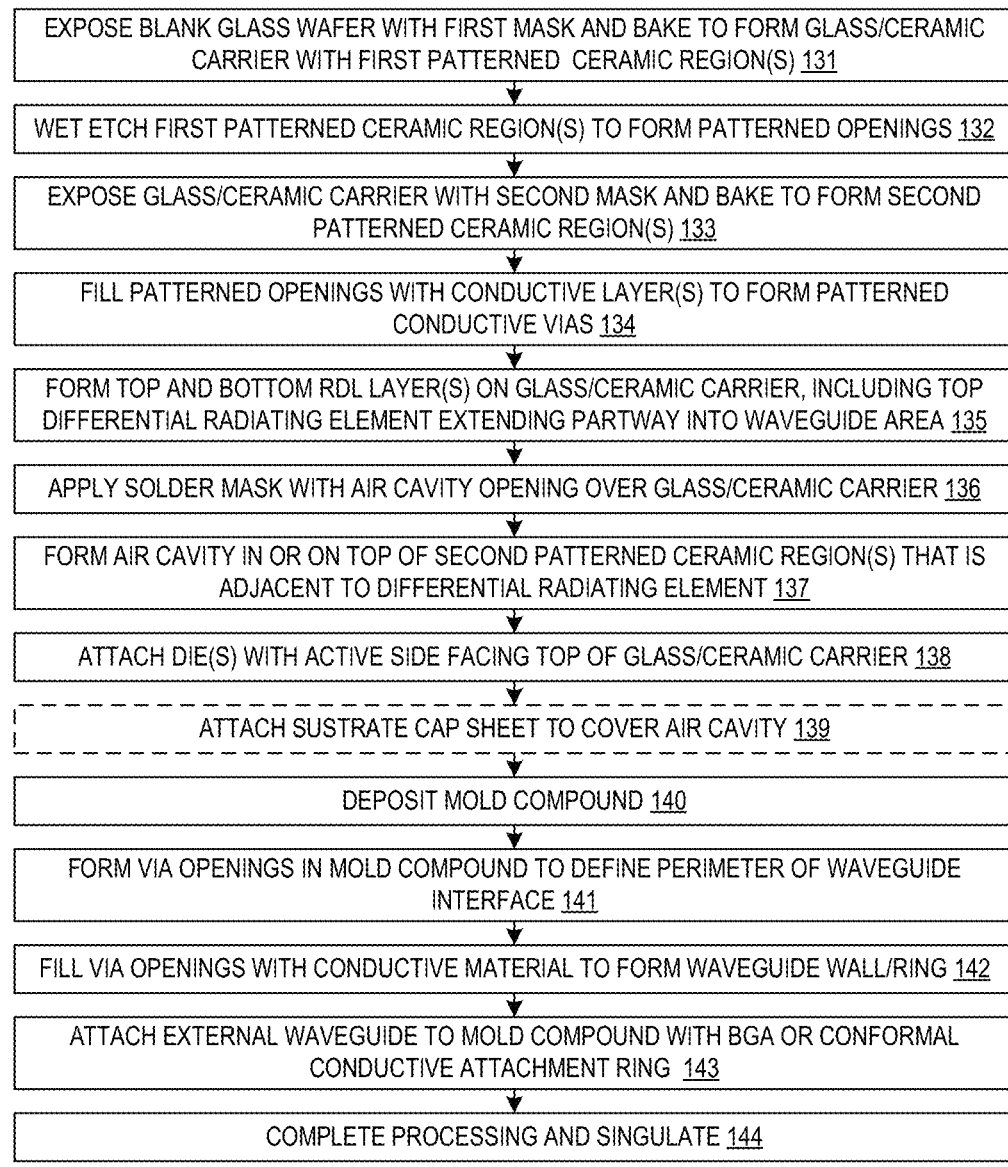
FIG. 13 illustrates a simplified flow chart showing the process for forming a packaged semiconductor device in accordance with selected embodiments of the present disclosure.

To further illustrate selected embodiments of the present disclosure, reference is now made to FIG. 13 which is a simplified flow chart 130 illustrating an example fabrication method for forming a packaged semiconductor device. In describing the fabrication methodology, the description is intended merely to facilitate understanding of various exemplary embodiments and not by way of limitation. Unless otherwise indicated, the steps may be provided in any desired order. Since the steps illustrated in FIG. 13 and described below are provided by way of example only, it will be appreciated that the sequence of illustrated steps may be modified, reduced or augmented in keeping with the alternative embodiments of the disclosure so that the method may include additional steps, omit certain steps, substitute or alter certain steps, or perform certain steps in an order different than that illustrated in FIG. 13. Thus, it will be appreciated that the methodology of the present invention may be thought of as performing the identified sequence of steps in the order depicted, though the steps may also be performed in parallel, in a different order, or as independent operations that are combined.

Once the methodology starts, a blank glass wafer is exposed with a first mask and baked to form glass/ceramic carrier having a first patterned set of one or more ceramic regions at step 131. For example, a blank APEX® glass wafer may be patterned to form ceramic regions by coating, exposing, and developing a layer of photoresist material over the glass wafer to define PR mask openings over areas where the first patterned set of one or more ceramic regions is to be formed. After forming the PR mask with any suitable photoresist pattern process, the masked glass wafer layer may be baked at a suitable temperature to alter the properties of exposed glass wafer to form the first patterned set of one or more ceramic regions which extend through the entire width of the glass/ceramic wafer.

At step 132, an etch process is applied to remove the first patterned set of one or more ceramic regions from the glass wafer, thereby forming patterned openings that extend through the entire width of the glass wafer. While any suitable etch process may be used, an example process may remove the first patterned set of one or more ceramic regions by using a plasma-based ash process and/or wet etch chemistry which selectively removes the patterned ceramic regions without etching the remaining glass wafer. The resulting patterned openings may be used to form through glass vias (TGV) which provide thermal and/or conductive structures through the glass/ceramic wafer.

At step 133, the glass/ceramic carrier is exposed with a second mask and baked to form a second patterned set of one or more ceramic regions using any suitable steps, such as coating, exposing, and developing a layer of photoresist material over the glass/ceramic carrier to define PR mask openings over areas where the second patterned set of one or more ceramic regions is to be formed. Subsequently, the masked glass/ceramic carrier may be baked at a suitable temperature to form the second patterned set of one or more ceramic regions which extend through the entire width of the glass/ceramic wafer. By defining the locations of the openings in the second mask, the second patterned set of one or more ceramic regions may be positioned to encompass at least the intended wave guide region, and may also extend into the intended die region.

At step 134, the patterned openings in the glass/ceramic carrier are filled with conductive material to form patterned conductive vias. In selected embodiments, the patterned openings are plated and filled with a metal, such as copper, to form the patterned conductive vias, and may optionally also be planarized or polished to remove excess metal. So constructed, the filled patterned openings form conductive vias (e.g., vias 41 in FIGS. 4A-B), including a first array of conductors 41D that will define a waveguide interface perimeter in the glass/ceramic carrier.

At step 135, redistribution lines (RDL) layers are formed on the top and bottom of the glass/ceramic carrier, including a differential radiating element extending partway into the intended waveguide area. In selected embodiments, the RDL layers may be formed by depositing, patterning, and etching top and bottom RDL layers top differential radiating element extending partway into waveguide area. For example, one or more top RDL layers (e.g., 51 in FIG. 5B) may be formed by sputter depositing a seed layer over the glass/ceramic carrier, forming a patterned photoresist mask with one or more RDL openings which overlap with the patterned conductive vias, electroplating one or more conformal conductive layers in the RDL opening(s), stripping the patterned photoresist mask, and then etching the exposed seed layer from the surface of the glass/ceramic carrier to define the top RDL layers. While a single RDL layer is described and depicted, it will be appreciated that multiple layers or levels of RDL layers may be formed within successive dielectric layers. For example, a multi-layer build up of RDL layers may include a metal layer, dielectric layer and micro vias. The resulting top RDL layers may include one or more IC routing lines or traces which are positioned to overlap with and connect to selected patterned conductive vias. The resulting top RDL layers may also include a separately defined loop layer which includes a pair of parallel waveguide feed lines and a radiating element to connect the pair of parallel waveguide feed lines in a loop. The loop layer is connected as an excitation element that is positioned in the intended waveguide region. In addition, the resulting top RDL layers may include a separately defined outer waveguide ring layer which has an open interior space and which is positioned around the periphery of the intended wave guide region. Thus formed, the waveguide lines and radiating element form a differential pair to waveguide launcher in package (LIP) structure on the top glass/ceramic carrier surface which is positioned to extend from the intended die region to the interior location of the intended waveguide region surrounded by the waveguide ring layer while leaving space for a subsequently-formed air cavity. In similar fashion, the resulting bottom RDL layers may be formed by using any suitable process for depositing, patterning, and etching one or more conductive layers on the bottom surface of the glass/ceramic carrier. As formed, the bottom RDL layer(s) may define a waveguide reflector interface layer which is positioned on the bottom carrier substrate surface to overlap with the intended waveguide region.

At step 136, a solder mask layer is applied to cover the top and bottom glass/ceramic carrier surfaces with an air cavity opening over area in the second patterned ceramic region(s) of the glass/ceramic carrier where the air cavity will be formed.

At step 137, an air cavity is formed in or on top of the second patterned ceramic regions(s) so as to be positioned adjacent to the differential radiating element and within the intended waveguide region. While any suitable process may be used to form the air cavity, the air cavity may be formed by performing a recess etch of the second patterned ceramic region exposed by the solder mask layer using a timed anisotropic etch to partially etch the second patterned ceramic region. The process parameters and timing of the recess etch process should be controlled to etch a specified depth which leaves a thin layer of the second patterned ceramic region below the air cavity at the bottom glass/ceramic carrier surface, thereby forming a waveguide short back that is defined by the bottom metal plane of the patterned waveguide region. In addition, a patterned mask and etch process may be controlled so that the air cavity is positioned inside the intended waveguide region and adjacent to the differential pair to waveguide LIP structure.

At step 138, one or more die are attached with their active sides facing the top of the glass/ceramic carrier. While any suitable die attach process may be used, the die may be attached as a flip-chip integrated circuit die to the pattern of conductive bumps or pillars formed on the top surface of the glass/ceramic carrier. Thus, the die may be attached and electrically connected to the top RDL layers forming the IC lines and the parallel waveguide lines using any suitable die attach technique for making electrical connection therebetween. Thus connected, the die may be connected over the waveguide lines to the radiating element to control the differential pair to waveguide launcher in package (LIP) structure on the top glass/ceramic carrier surface. In addition, the die may be attached and electrically connected to control the waveguide ring layer formed on the on the top surface of the glass/ceramic carrier to define the intended waveguide region.

At step 139, a substrate cap sheet may be attached to the glass/ceramic carrier to cover the air cavity. In selected embodiments, the substrate cavity cap sheet may be formed with any suitable laminate or non-conductive bonding attachment process for forming a low loss dielectric to reduce the transition loss. For example, a laminate sheet having low dielectric constant and low dielectric loss properties may be attached to cover the air cavity and prevent it from being filled by molding compound material. However and as indicated with the dashed lines, the substrate cap sheet is an optional step in embodiments where an air cavity is formed internally within the glass/ceramic carrier so that then there is no need for the protective substrate cavity cap sheet.

At step 140, a mold compound is deposited to encapsulate the die and other elements formed on the top surface of the glass/ceramic carrier in a protective package. In WSDP processing, the molding compound is typically applied in a liquid or semi-liquid state to cover the arrangement of attached dies and associated other components. A vacuum may then be applied to the molding compound to extract bubbles that could otherwise create voids in the molding compound. The molding compound would then be cured, and optionally planarized after curing.

At step 141, via openings are formed in the molding compound to define a perimeter of the circuit waveguide interface. As disclosed herein, the via openings can be formed with any suitable processing, including selective or patterned etching and laser drilling.

At step 142, the via openings are filled with conductive layers, such as metal, to form a waveguide wall or ring. The waveguide wall or ring may be formed with one or more electroplating layers, diffusion barrier layers, adhesion layers, conductive layers, and the like. In selected embodiments, the conductive layers are formed by first depositing conductive liners formed of titanium, titanium nitride, tantalum, tantalum nitride, or other alternatives. On the conductive liner layers, conductive layers may be formed with any suitable conductive material, such as copper, a copper alloy, silver, gold, tungsten, aluminum, or the like. In selected embodiments, the conductive layers may be formed by blanket depositing a liner in the via openings, followed by depositing a thin seed layer of copper or copper alloy over the liner, and filling the rest of via openings with metallic material, such as by using electro-plating, electroless plating, deposition, or the like. A planarization process, such as chemical mechanical planarization (CMP) may then be performed to level the surface of conductive lines and to remove excess conductive materials from the top surface of the mold compound. Subsequently, a masked etch process may be applied to pattern the conductive layers. As constructed, the conductive layers form a perimeter array of conductors around the waveguide interface that will define a waveguide interface perimeter in the molding compound. In addition or in the alternative, the conductive layers may form a conductive ring structure around the waveguide interface that will define a waveguide interface perimeter in the molding compound.

At step 143, an external waveguide is attached with package terminations or connections to the waveguide wall or ring formed in the mold compound of the packaged semiconductor device. In selected embodiments, a ball grid array (BGA) or other leads can be attached to the waveguide wall or ring formed in the mold compound around the perimeter of the waveguide interface. In other embodiments, a conformal conductive attachment ring can be attached to the waveguide wall or ring formed in the mold compound around the perimeter of the waveguide interface. These package terminations around the perimeter of the circuit waveguide interface effectively extend the circuit waveguide interface outside the package, and thus can be used to connect the circuit waveguide interface to a waveguide or other element.

At step 144, one or more additional backend of line (BEOL) and/or package processing steps are performed on the glass/ceramic carrier wafer/die. In selected embodiments, the processing at step 144 includes processing and singulating the molded compound, dies, and circuit waveguide interfaces into individual molded packages. This would typically be accomplished using a suitable sawing or scribing technique. So constructed, each package could include one or more IC dies and one or more associated circuit waveguide interfaces. After completion of the BEOL and/or package processing steps, the fabrication method ends.

The fabrication method 130 illustrates an example technique that facilitates the formation of a circuit waveguide interface during a WSDP process that is used to package a semiconductor device. The use of the WSDP process can allow the integration of a radiating element having short feed line with an adjacent air cavity formed in the high-k glass/ceramic carrier to address millimeter design challenges and to maximize the performance enhancement by providing an air cavity structure in waveguide short back that is designed to provide electrical matching and to reduce insertion loss to 1.0 dB or lower. Additionally, the use of the WSDP process can allow the formation of a packaged die and circuit waveguide interface with relatively little cost and process complexity (e.g., without requiring additional machining of the waveguide interface or an external waveguide adapter). Examples of embodiments and applications for the waveguide interface include millimeter wave (mmW) and radio frequency (RF) applications.

The embodiments described herein can provide circuit waveguide interfaces for semiconductor devices with both relatively high performance and low cost. In general, the embodiments described herein provide a differential pair to waveguide exciting element with a short feed line formed on the glass/ceramic carrier to connect to the attached die, thereby significantly reducing insertion loss. And by forming the waveguide interface with a high-k ceramic region of a glass/ceramic carrier which includes an air cavity that is adjacent to the waveguide exciting element, high frequency performance is improved for millimeter wave and radio frequency applications. Specifically, during the packaging process, photolithography and other wafer-type processing techniques are used to form one or more metallization layers (e.g., copper) in a wafer-like glass/ceramic panel, including a radiating element that is connected over a short feed line to a die attach area and a surrounding conductive via/ring pattern at the periphery of a circuit waveguide region. Subsequently, singulated die are arranged and attached on the wafer-like glass/ceramic panel, either before or after forming a partially recessed air cavity adjacent to the radiating element in the circuit waveguide region. After covering air cavity with a laminate sheet, a molding compound is injected or deposited over the die and radiating element to form an encapsulating package. A circuit waveguide interface is formed in the encapsulating package and subsequent metallization layers. This circuit waveguide interface can include an array of first conductors arranged in the molding compound, and a reflector interface and excitation element formed during metallization.

By now it should be appreciated that there has been provided a method for making a package assembly, such as a wafer-scale die packaging device (WSDP) device. In the disclosed method, a glass carrier substrate is provided that is formed with a high-k dielectric material. In selected embodiments, the glass carrier substrate is provided as a class wafer formed with a material having a dielectric constant k that is greater than or equal to approximately k=5.8. The disclosed method also includes forming a ceramic region in the glass carrier substrate which includes a defined waveguide area and which extends to a defined die attach area. In selected embodiments, the ceramic region is formed by exposing the glass carrier substrate to a mask pattern having a mask opening over at least the defined waveguide area, and then baking the glass carrier substrate to convert any region of the glass carrier substrate exposed by the mask opening to ceramic, thereby forming the ceramic region. In addition, the disclosed method includes forming a plurality of conductive patterns on a first surface of the glass carrier substrate. The conductive patterns include a differential waveguide launcher disposed over the ceramic region and formed with a radiating element connected to a pair of signal lines extending from the defined waveguide area to the defined die attach area. In addition, conductive patterns include a patterned array of one or more conductors disposed over the ceramic region in a waveguide conductor ring positioned in the defined waveguide area to surround the radiating element on at least three sides. In selected embodiments, the conductive patterns may be formed by electroplating one or more conformal conductive layers over the first surface of the glass carrier substrate, and then selectively etching the one or more conformal conductive layers to form the differential waveguide launcher and the patterned array of one or more conductors as coplanar layers on the first surface of the glass carrier substrate. The disclosed method also includes forming an air cavity in the ceramic region that is positioned in the defined waveguide area to be adjacent to the radiating element and surrounded on at least three sides by the patterned array of one or more conductors. In selected embodiments, the air cavity may be formed by partially etching the ceramic region using a timed anisotropic etch to form the air cavity having a predetermined depth which leaves a thin layer of the ceramic region below the air cavity, and then covering the air cavity with a cap sheet comprising a laminate or non-conductive bonding layer of a low loss dielectric material. In addition, the disclosed method includes attaching a semiconductor die to the glass carrier substrate at the defined die attach area to make electrical connection to the differential waveguide launcher. The disclosed method also includes forming a molding compound that covers the semiconductor die and the plurality of conductive patterns, the molding compound having a first side attached to the glass carrier substrate and a second side opposite the first side. In addition, the disclosed method includes forming a first array of conductors in the molding compound that are aligned for connection with the plurality of conductive patterns, the first array of conductors extending from the molding compound first side to the molding compound second side, the first array of conductors arranged in the molding compound to define a first waveguide interface perimeter surrounding a first waveguide interface interior. In selected embodiments, the first array of conductors are formed by forming vias in the molding compound, and then filling the vias with conductive material. In selected embodiments, the disclosed method also includes physically coupling the first array of conductors to an external waveguide with an array of conductive balls. In other embodiments, the disclosed method also includes physically coupling the first array of conductors to an external waveguide with a conformal conductive electromagnetic interference O-ring gasket.

In another form, there is provided a wafer-scale packaged semiconductor device and associated method of manufacture. The disclosed semiconductor device includes a high-k dielectric carrier substrate having first and second carrier surfaces, where the high-k dielectric carrier substrate includes a glass layer surrounding a ceramic layer that defines a waveguide region and that extends partially into a die region formed in the glass layer. In selected embodiments, the high-k dielectric carrier substrate is formed with a material having a dielectric constant k of at least approximately k=5.8. In addition, the disclosed semiconductor device includes a first array of conductors formed on the first carrier surface to define a plurality of integrated circuit connection lines positioned in the die region, a separate waveguide ring positioned to substantially surround the waveguide region, and a separate excitation element positioned to extend from the die region to a first interior side of the waveguide region to be substantially surrounded by the separate waveguide ring waveguide region. In selected embodiments, the separate excitation element is a differential pair to waveguide launcher in package structure which may include one or more waveguide feed lines positioned to extend from the die region to the first interior side of the waveguide region, and a radiating element connected to the one or more waveguide feed lines and positioned on the first interior side of the waveguide region to be substantially surrounded by the separate waveguide ring. The disclosed semiconductor device also includes a semiconductor die attached to the plurality of integrated circuit connection lines and the separate excitation element on the first carrier surface of the high-k dielectric carrier substrate. In addition, the disclosed semiconductor device includes a first air cavity formed to extend partially into the ceramic layer from the first carrier surface and positioned on a second exterior side of the waveguide region to be substantially surrounded by the separate waveguide ring. The disclosed semiconductor device also includes a cavity cap sheet formed on the first carrier surface to cover the first air cavity. In addition, the disclosed semiconductor device includes a molding compound that encapsulates the semiconductor die and cavity cap sheet on the first carrier surface without filling the first air cavity. In selected embodiments, the disclosed semiconductor device may also include a second array of conductors extending from bottom to top surfaces of the molding compound and positioned to define a first waveguide interface perimeter surrounding a first waveguide interface interior. In such embodiments, the semiconductor device may include an array of conductive balls attached to the second array of conductors at the top surface of the molding compound, and an external waveguide physically coupled to the array of conductive balls. In other embodiments, the semiconductor device may include a conformal conductive electromagnetic interference O-ring gasket attached to the second array of conductors at the top surface of the molding compound, and an external waveguide physically coupled to the conformal conductive electromagnetic interference O-ring gasket. In selected embodiments, the disclosed semiconductor device may also include a conductive layer formed at the second carrier surface of the high-k dielectric carrier substrate to define a waveguide reflector interface layer.

In yet another form, there is provided a method for making a packaged semiconductor device, such as a wafer-scale die packaging device (W SDP) device. The disclosed method includes providing a high-k dielectric carrier substrate having first and second carrier substrate surfaces, where the high-k dielectric carrier substrate includes a glass layer surrounding a ceramic layer that defines and surrounds a millimeter waveguide region. The disclosed method also includes forming a first array of conductors on the first carrier substrate surface to define a plurality of integrated circuit connection lines positioned in a die region, a separate waveguide ring positioned to substantially surround the millimeter waveguide region, and a separate excitation element positioned to extend from the die region to the millimeter waveguide region with a peripheral end of the separate excitation element substantially surrounded by the separate waveguide ring. In selected embodiments, the formation of the first array of conductors includes forming the separate excitation element as a differential pair to waveguide launcher in package structure which includes one or more waveguide feed lines positioned to extend from the die region to the millimeter waveguide region, and a radiating element connected to the one or more waveguide feed lines and positioned in the millimeter waveguide region to be substantially surrounded by the separate waveguide ring. In addition, the disclosed method includes partially etching the ceramic layer to form a first air cavity positioned adjacent to the peripheral end of the separate excitation element in the millimeter waveguide region to be substantially surrounded by the separate waveguide ring. The disclosed method also includes attaching a semiconductor die including an integrated circuit to the plurality of integrated circuit connection lines and the separate excitation element on the first carrier surface of the high-k dielectric carrier substrate. In addition, the disclosed method includes attaching a laminate cap sheet on the first carrier substrate surface to cover the first air cavity. The disclosed method also includes encapsulating the semiconductor die, first array of conductors, and laminate cap sheet with a molding compound layer having a first side attached to the first carrier substrate surface and a second side opposite the first side. In selected embodiments, the disclosed method also includes forming a second array of conductors in the molding compound layer that are aligned for connection with the separate waveguide ring, the second array of conductors extending from the first side of the molding compound layer to the second side of the molding compound layer, thereby defining a first waveguide interface perimeter surrounding the millimeter waveguide region.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment of the present disclosure, it being understood that various changes may be made in the function and arrangement of elements described in an exemplary embodiment without departing from the scope of the invention as set forth in the appended claims and their legal equivalents.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method comprising:
   providing a glass carrier substrate formed with a high-k dielectric material;
   forming a ceramic region in the glass carrier substrate which includes a defined waveguide area and which extends to a defined die attach area;
   forming a plurality of conductive patterns on a first surface of the glass carrier substrate comprising:
      a differential waveguide launcher disposed over the ceramic region and formed with a radiating element connected to a pair of signal lines extending from the defined waveguide area to the defined die attach area,
      a patterned array of one or more conductors disposed over the ceramic region in a waveguide conductor ring positioned in the defined waveguide area to surround the radiating element on at least three sides;
   forming an air cavity in the ceramic region that is positioned in the defined waveguide area to be adjacent to the radiating element and surrounded on at least three sides by the patterned array of one or more conductors;
   attaching a semiconductor die to the glass carrier substrate at the defined die attach area to make electrical connection to the differential waveguide launcher;
   forming a molding compound that covers the semiconductor die and the plurality of conductive patterns, the molding compound having a first side attached to the glass carrier substrate and a second side opposite the first side; and
   forming a first array of conductors in the molding compound that are aligned for connection with the plurality of conductive patterns, the first array of conductors extending from the molding compound first side to the molding compound second side, the first array of conductors arranged in the molding compound to define a first waveguide interface perimeter surrounding a first waveguide interface interior.

2. The method of claim 1, where providing the glass carrier substrate comprises providing a glass carrier wafer formed with a material having a dielectric constant k that is greater than or equal to approximately k=5.8.

3. The method of claim 1, where forming the ceramic region in the glass carrier substrate comprises:
   exposing the glass carrier substrate to a mask pattern having a mask opening over at least the defined waveguide area; and
   baking the glass carrier substrate to convert any region of the glass carrier substrate exposed by the mask opening to ceramic, thereby forming the ceramic region.

4. The method of claim 1, where forming the plurality of conductive patterns comprises:
   electroplating one or more conformal conductive layers over the first surface of the glass carrier substrate; and
   selectively etching the one or more conformal conductive layers to form the differential waveguide launcher and the patterned array of one or more conductors as coplanar layers on the first surface of the glass carrier substrate.

5. The method of claim 1, where forming the air cavity in the ceramic region comprises:

partially etching the ceramic region using a timed anisotropic etch to form the air cavity having a predetermined depth which leaves a thin layer of the ceramic region below the air cavity; and covering the air cavity with a cap sheet comprising a laminate or non-conductive bonding layer of a low loss dielectric material.

6. The method of claim 1, where forming the first array of conductors in the molding compound comprises:

forming vias in the molding compound; and filling the vias with conductive material.

7. The method of claim 1, further comprising physically coupling the first array of conductors to an external waveguide with an array of conductive balls.

8. The method of claim 1, further comprising physically coupling the first array of conductors to an external waveguide with a conformal conductive electromagnetic interference O-ring gasket.

9. A method for forming a semiconductor device, comprising:

providing a high-k dielectric carrier substrate having first and second carrier substrate surfaces and comprising a glass layer surrounding a ceramic layer that defines and surrounds a millimeter waveguide region;

forming a first array of conductors on the first carrier substrate surface to define a plurality of integrated circuit connection lines positioned in a die region, a separate waveguide ring positioned to substantially surround the millimeter waveguide region, and a separate excitation element positioned to extend from the die region to the millimeter waveguide region with a peripheral end of the separate excitation element substantially surrounded by the separate waveguide ring;

partially etching the ceramic layer to form a first air cavity positioned adjacent to the peripheral end of the separate excitation element in the millimeter waveguide region to be substantially surrounded by the separate waveguide ring;

attaching a semiconductor die including an integrated circuit to the plurality of integrated circuit connection lines and the separate excitation element on the first carrier surface of the high-k dielectric carrier substrate;

attaching a laminate cap sheet on the first carrier substrate surface to cover the first air cavity; and encapsulating the semiconductor die, first array of conductors, and laminate cap sheet with a molding compound layer having a first side attached to the first carrier substrate surface and a second side opposite the first side.

10. The method of claim 9, further comprising forming a second array of conductors in the molding compound layer that are aligned for connection with the separate waveguide ring, the second array of conductors extending from the first side of the molding compound layer to the second side of the molding compound layer, thereby defining a first waveguide interface perimeter surrounding the millimeter waveguide region.

11. The method of claim 9, where forming the first array of conductors comprises forming the separate excitation element as a differential pair to waveguide launcher in package structure comprising:

one or more waveguide feed lines positioned to extend from the die region to the millimeter waveguide region, and a radiating element connected to the one or more waveguide feed lines and positioned in the millimeter waveguide region to be substantially surrounded by the separate waveguide ring.

\* \* \* \* \*